(12) United States Patent
Tokuda et al.

(10) Patent No.: US 6,949,749 B2
(45) Date of Patent: Sep. 27, 2005

(54) ELECTROMAGNETIC IMAGING APPARATUS AND MANUFACTURING METHOD THEREFOR

(75) Inventors: Satoshi Tokuda, Kusatsu (JP); Toshinori Yoshimuta, Takatsuki (JP); Yoshihiro Izumi, Kashihara (JP); Osamu Teranuma, Tenri (JP)

(73) Assignees: Shimadzu Corporation, Kyoto (JP); Sharp Kabushiki Kaisha, Osaka (JP)

( * ) Notice: Subject to any disclaimer, the term of this patent is extended or adjusted under 35 U.S.C. 154(b) by 737 days.

(21) Appl. No.: 09/874,397

(22) Filed: Jun. 6, 2001

(65) Prior Publication Data

US 2002/0014593 A1 Feb. 7, 2002

(30) Foreign Application Priority Data

Jun. 8, 2000 (JP) ...................................... 2000-172068
Mar. 1, 2001 (JP) ......................................... 2001-56991

(51) Int. Cl.⁷ .................................................. G01J 5/22
(52) U.S. Cl. ............................. 250/370.09; 250/370.08
(58) Field of Search ....................... 250/370.09, 370.08, 250/591, 338.4, 580, 585, 370.01

(56) References Cited

U.S. PATENT DOCUMENTS

| | | | | |
|---|---|---|---|---|
| 5,017,989 A | * | 5/1991 | Street et al. | 257/291 |
| 5,313,066 A | * | 5/1994 | Lee et al. | 250/370.09 |
| 5,319,206 A | * | 6/1994 | Lee et al. | 250/370.09 |
| 5,661,309 A | * | 8/1997 | Jeromin et al. | 250/580 |
| 6,243,441 B1 | * | 6/2001 | Zur | 378/98.8 |
| 6,483,099 B1 | * | 11/2002 | Yu et al. | 250/214.1 |

* cited by examiner

Primary Examiner—Constantine Hannaher
Assistant Examiner—Otilia Gabor
(74) Attorney, Agent, or Firm—Rader, Fishman & Grauer PLLC

(57) ABSTRACT

A detector panel having a bias application electrode and a converter layer formed on a supporting substrate, and a readout panel (active matrix panel), are bonded to each other directly through a single layer of electroconductive resin. That is, a pattern of photosensitive resin is formed beforehand on reading electrodes of the readout panel, and this readout panel and the converter layer are bonded together directly. Since the converter layer has no pixel electrodes formed thereon, the converter layer need not be smoothed, and the two panels need not be positionally adjusted to each other with high precision.

17 Claims, 7 Drawing Sheets

ELECTROMAGNETIC IMAGING APPARATUS AND MANUFACTURING METHOD THEREFOR

BACKGROUND OF THE INVENTION

(1) Field of the Invention

This invention relates to an electromagnetic imaging apparatus for use in the medical and industrial fields to detect electromagnetic waves such as light and other radiation, and to a method of manufacturing such apparatus. More particularly, the invention relates to a technique for depositing and joining a detector panel for detecting electromagnetic radiation and a readout panel for reading, from the detector panel, carriers which are electron-hole pairs generated as a result of detection of the electromagnetic radiation.

(2) Description of the Related Art

A construction of a conventional electromagnetic imaging apparatus will be described with reference to FIGS. 1 and 2.

FIG. 1 is a sectional view showing a detector panel for detecting electromagnetic radiation. FIG. 2 is a sectional view of the detector panel and a readout panel joined together. For expediency of illustration, FIG. 1 shows only a fragment corresponding to three pixels, and FIG. 2 only a fragment corresponding to one pixel.

As shown in FIG. 1, a detector panel 10 of a conventional electromagnetic imaging apparatus has a bias application electrode 12 formed on a substantially entire surface of a supporting substrate 11. Deposited on this bias application electrode 12 (on its under surface in FIG. 1) is a converter layer 13 for generating carriers, which are electron-hole pairs, as a result of detecting electromagnetic radiation. Numerous pixel electrodes 14 are formed on this converter layer 13. In order to promote the rate of collecting the carriers (hereinafter referred to as "charges" also) from the detector panel 10 for an improved readout response, and also to prevent interpixel crosstalk (hereinafter just "crosstalk" where appropriate) of the carriers, it is believed desirable to set a low resistance to the connection between the detector panel 10 and a readout panel 20 to be described hereinafter. Thus, a metallic material is used for the pixel electrodes 14.

As shown in FIG. 2, the readout panel 20 of the conventional electromagnetic imaging apparatus is in the form of an active matrix panel including an insulating substrate 21 having electrode lines 22 arranged in a lattice or crisscross pattern thereon, a plurality of switching elements 23 provided one for each lattice section, a plurality of reading electrodes 24 connected to the electrode lines 22 through the switching elements 23, and a plurality of charge collecting stores 25 electrically connected to the reading electrodes 24. The readout panel 20 will be called the active matrix panel in the following description.

The detector panel 10 and active matrix panel 20 are connected together through an electroconductive resin 30 disposed between each pair of pixel electrode 14 and reading electrode 24.

According to the conventional electromagnetic imaging apparatus having the above construction, incident radiation generates charges in the converter layer 13 of detector panel 10. These charges are transmitted through the pixel electrodes 14, electroconductive resin 30 and reading electrodes 24 to the charge collecting stores 25 to accumulate therein. The charges collected in the charge collecting stores 25 are read through the switching elements 23 turned on.

The above conventional construction has the following drawbacks.

In order to form the minute pixel electrodes 14 on the converter layer 13 of detector panel 10 by photolithography, the surface of converter layer 13 must be made a flat surface of 1 micron or less, for example. The converter layer 13 is formed in a relatively large thickness. As a result, its thickness tends to vary, making it difficult to level out the surface over large areas.

In addition, formation of the pixel electrodes 14 requires various devices such as a pattern forming mask, an exposing device and an etching device.

Further, a high degree of precision is required in adjusting a relative position between the pixel electrodes 14 of detector panel 10 and the reading electrodes 24 of active matrix panel 20, which complicates the manufacturing process.

SUMMARY OF THE INVENTION

This invention has been made having regard to the state of the art noted above, and has for a primary object to provide an electromagnetic imaging apparatus and a manufacturing method therefor, which allow for a simplified structure for joining a detector panel and a readout panel, and a simplified manufacturing process.

The above object is fulfilled, according to this invention, by an electromagnetic imaging apparatus comprising a detector panel having a bias application electrode formed on one surface of a supporting substrate, and a converter layer formed on the bias application electrode for generating carriers, which are electron-hole pairs, in response to electromagnetic radiation to be detected, and a readout panel for reading charges generated in the detector panel, wherein the converter layer of the detector panel and the readout panel are bonded to each other directly through a single layer of electroconductive material filled therebetween.

That is, the electromagnetic imaging apparatus has a simplified construction since the converter layer is bonded to the readout panel directly through a single layer of electroconductive material.

In the electromagnetic imaging apparatus according to this invention, the readout panel may be an active matrix panel of one-dimensional array construction including electrode lines arranged in form of a lattice on an insulating substrate, a plurality of switching elements provided one for each section of the lattice, a plurality of reading electrodes connected to the electrode lines through the switching elements, respectively, and a plurality of charge collecting stores electrically connected to the reading electrodes, respectively, the converter layer of the detector panel and the reading electrodes of the active matrix panel of one-dimensional array construction being bonded to each other directly through the single layer of electroconductive material filled therebetween.

With the above apparatus according to the invention, carriers (charges) generated in the converter layer of the detector panel are read by the active matrix panel of one-dimensional array construction through the electroconductive material directly bonding the converter layer and the active matrix panel of one-dimensional array construction.

Specifically, the charges generated in the converter layer are collected in the charge collecting stores through the electroconductive material and the reading electrodes of the active matrix panel of one-dimensional array construction. The charges collected in the charge collecting stores are read through the switching elements turned on.

That is, the electromagnetic imaging apparatus has a simplified construction since the converter layer of the detector panel is bonded to the reading electrodes of the active matrix panel of one-dimensional array construction directly through the single layer of electroconductive material.

In the electromagnetic imaging apparatus according to this invention, the readout panel may be an active matrix panel of two-dimensional matrix construction including electrode lines arranged in form of a lattice on an insulating substrate, a plurality of switching elements provided one for each section of the lattice, a plurality of reading electrodes connected to the electrode lines through the switching elements, respectively, and a plurality of charge collecting stores electrically connected to the reading electrodes, respectively, the converter layer of the detector panel and the reading electrodes of the active matrix panel of two-dimensional matrix construction being bonded to each other directly through the single layer of electroconductive material filled therebetween.

With the above apparatus according to the invention, carriers (charges) generated in the converter layer of the detector panel are read by the active matrix panel of two-dimensional matrix construction through the electroconductive material directly bonding the converter layer and the active matrix panel of two-dimensional matrix construction. Specifically, the charges generated in the converter layer are collected in the charge collecting stores through the electroconductive material and the reading electrodes of the active matrix panel of two-dimensional matrix construction. The charges collected in the charge collecting stores are read through the switching elements turned on.

That is, the electromagnetic imaging apparatus has a simplified construction since the converter layer of the detector panel is bonded to the reading electrodes of the active matrix panel of two-dimensional matrix construction directly through the single layer of electroconductive material.

In the electromagnetic imaging apparatus according to this invention, the electroconductive material is provided at a filling rate of 20 to 90% per unit area of the converter layer of the detector panel.

With the above apparatus, the filling rate of the electroconductive material set to a range of 20 to 90% per unit area of the converter layer of the detector panel is effective to avoid variations in the pattern size of the electroconductive material and to avoid crosstalk.

That is, since a deterioration in image quality due to crosstalk is avoided, high sensitivity output images are secured. Since variations in the pattern size are avoided, an improvement is made in the yield of manufacture.

In the electromagnetic imaging apparatus according to this invention, the electroconductive material is an electroconductive resin.

With the above apparatus according to the invention, carriers generated in the converter layer of the detector panel are read by the readout panel through the electroconductive resin directly bonding the converter layer and readout panel.

That is, the electromagnetic imaging apparatus has a simplified construction since the converter layer of the detector panel is bonded to the reading electrodes of the readout panel directly through the electroconductive resin.

Preferably, the above electroconductive resin has carbon powder, metallic particles or nickel-plated particles dispersed in an adhesive and photosensitive resin.

In the electromagnetic imaging apparatus according to this invention, the electroconductive material may be an anisotropic electroconductive resin.

In the above apparatus, the detector panel and readout panel are bonded directly through the anisotropic electroconductive resin having metallic particles dispersed in an adhesive insulator.

That is, the detector panel and readout panel are electrically connected by the metallic particles. However, the metallic particles are separated from one another by the insulator in directions along the bonded surfaces.

Since an electric insulation in the directions along the bonded surfaces is achieved simply, crosstalk is avoided effectively.

As another aspect, the invention provides an electromagnetic imaging apparatus comprising a detector panel having a bias application electrode formed on one surface of a supporting substrate, and a converter layer formed on the bias application electrode for generating carriers, which are electron-hole pairs, in response to electromagnetic radiation to be detected, and a readout panel for reading charges generated in the detector panel, the electromagnetic imaging apparatus further comprising a blocking layer formed in at least one of positions between the bias application electrode and the converter layer and on a surface of the converter layer opposed to the readout panel, wherein the surface layer of said detector panel either said converter layer opposed to said readout panel or said blocking layer formed on said converter layer and said readout panel are bonded to each other directly through a single layer of electroconductive material filled therebetween.

In the above apparatus according to this invention, a blocking layer is formed at least either between the bias application electrode and the converter layer that generates carriers, i.e. electron-hole pairs, or on the surface of the converter layer opposed to the readout panel, That is, carriers not contributing to sensitivity are stopped entering the converter layer when a voltage is applied to the bias application electrode, thereby increasing the SN ratio.

Preferably, the blocking layer comprises an n-type semiconductor film, a p-type semiconductor film or a heterojunction film applied to the surface of the converter layer.

In a further aspect of this invention, there is provided a method of manufacturing an electromagnetic imaging apparatus including a detector panel having a bias application electrode formed on one surface of a supporting substrate, and a converter layer formed on the bias application electrode for generating carriers, which are electron-hole pairs, in response to electromagnetic radiation to be detected, and a readout panel for reading charges generated in the detector panel, wherein the readout panel is an active matrix panel including electrode lines arranged in form of a lattice on an insulating substrate, a plurality of switching elements provided one for each section of the lattice, a plurality of reading electrodes connected to the electrode lines through the switching elements, respectively, and a plurality of charge collecting stores electrically connected to the reading electrodes, respectively, the method comprising:

a step of preparing the detector panel;

a step of preparing the active matrix panel;

a step of forming a single layer of electroconductive material on each of the reading electrodes of the active matrix panel; and a step of applying the detector panel to the active matrix panel with the single layer of electroconductive material formed thereon to bond the converter layer of the detector panel and each of the reading electrodes of the active matrix panel directly through the single layer of electroconductive material.

In the above manufacturing method according to this invention, the detector panel and the active matrix panel are prepared separately. After the electroconductive material is formed on each reading electrode of the active matrix panel, the detector panel and the active matrix panel are fitted together, and the converter layer of the detector panel and the reading electrodes of the active matrix panel are bonded directly through the electroconductive material. Since the converter layer has no electrodes formed thereon corresponding to the reading electrodes, the detector panel and the active matrix panel may be bonded simply without a strict positional adjustment therebetween. In the absence of pixel electrodes on the converter layer of the detector panel, the surface of the converter layer need not be smoothed by polishing to form pixel electrodes. Further, the step of manufacturing the detector panel does not include a photolithographic process to prepare pixel electrodes, and hence a simplified manufacturing process. There also occurs a reduced chance of the converter layer being contaminated, thereby avoiding a deterioration in characteristics of the converter layer due to contamination.

Preferably, the above active matrix panel has a one-dimensional array construction or two-dimensional matrix construction.

The method of manufacturing an electromagnetic imaging apparatus according to this invention may further comprise a step of forming a blocking layer in at least one of positions between the bias application electrode and the converter layer and on a surface of the converter layer opposed to the readout panel.

That is, blocking layers may be formed between the bias application electrode and converter layer and on the entire surface of the converter layer opposed to the readout panel. The blocking layers thus formed need not be patterned in a corresponding relationship to the electroconductive resin. The surfaces of the blocking layers need not be smoothed by polishing, either. That is, the manufacturing process is simplified. Since the blocking layers prevent the carriers not contributing to sensitivity from entering the converter layer, the electromagnetic imaging apparatus has an improved SN ratio.

BRIEF DESCRIPTION OF THE DRAWINGS

For the purpose of illustrating the invention, there are shown in the drawings several forms which are presently preferred, it being understood, however, that the invention is not limited to the precise arrangement and instrumentalities shown.

DESCRIPTION OF THE PREFERRED EMBODIMENTS

Preferred embodiments of the present invention will be described in detail hereinafter with reference to the drawings.

Figure 3:
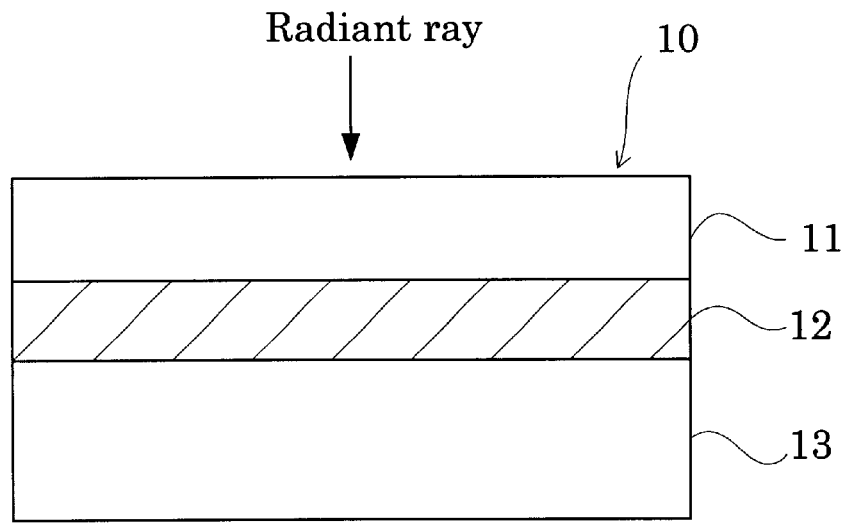
FIG. 3 is a sectional view of a detector panel of an electromagnetic imaging apparatus according to this invention.
Figure 4:
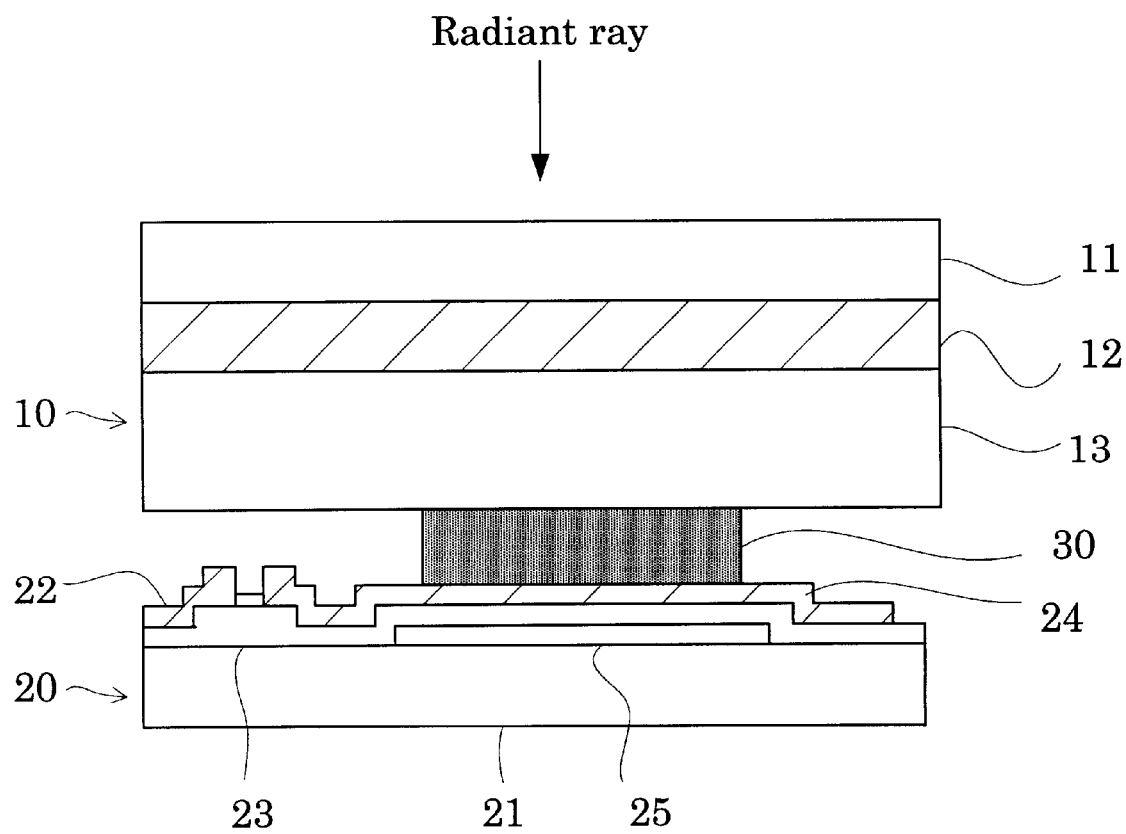
FIG. 4 is a sectional view of the electromagnetic imaging apparatus according to this invention.

FIG. 3 is a sectional view showing a detector panel used in an electromagnetic imaging apparatus according to this invention for detecting electromagnetic radiation. FIG. 4 is a sectional view of the detector panel and a readout panel joined together. For expediency of illustration, FIG. 4 shows only a fragment corresponding to one pixel.

The electromagnetic imaging apparatus in this embodiment, broadly, includes a detector panel 10 for generating carriers, which are electron-hole pairs, in response to incident radiation, and a readout panel (hereinafter referred to as "active matrix panel") 20 for reading charges generated in the detector panel 10. The detector panel 10 and active matrix panel 20 are joined and electrically connected together through an electroconductive resin 30. The electroconductive resin 30 corresponds to the electroconductive material in this invention. The constructions and functions of these components will be described in detail hereinafter.

Figure 1:
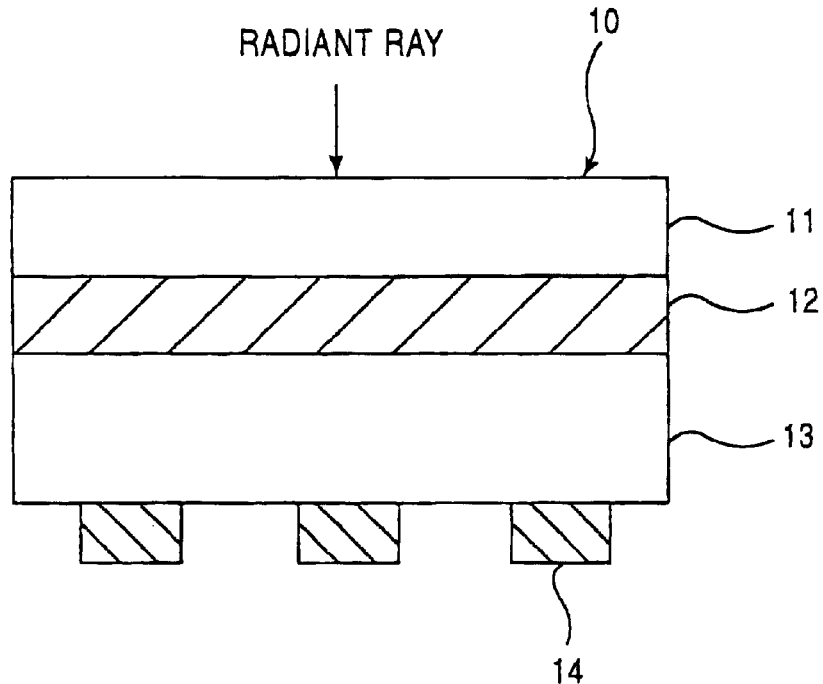
FIG. 1 is a sectional view showing a detector panel of a conventional electromagnetic imaging apparatus.

As shown in FIG. 3, the detector panel 10 has a supporting substrate 11 disposed at a radiation incidence side, a bias application electrode 12 deposited on a surface of supporting substrate 11 (on its under surface in FIG. 3), and a converter layer 13 deposited on the bias application electrode 12 for generating carriers, which are electron-hole pairs, in response to incident radiation. As will be clear from a comparison with the detector panel of the conventional apparatus shown in FIG. 1, the detector panel 10 in this embodiment does not include the pixel electrodes 14 provided for the detector panel of the conventional apparatus.

The supporting substrate 11 is formed of quartz, glass, ceramic ($Al_2O_3$, AlN), carbon or silicon, for example. The bias application electrode 12 is formed of ITO (indium tin oxide), Au, Pt, Ti or Ni, for example.

The converter layer 13, preferably, is formed of a material sensitive to radiation (e.g. X rays) to be detected, and having excellent response and steady characteristics. Such a material may, for example, be a single crystal, polycrystal or amorphous semiconductor material such as Si, Se, CdTe, CdZnTe, ZnTe, $PbI_2$, $HgI_2$ or TlBr.

Figure 5A:
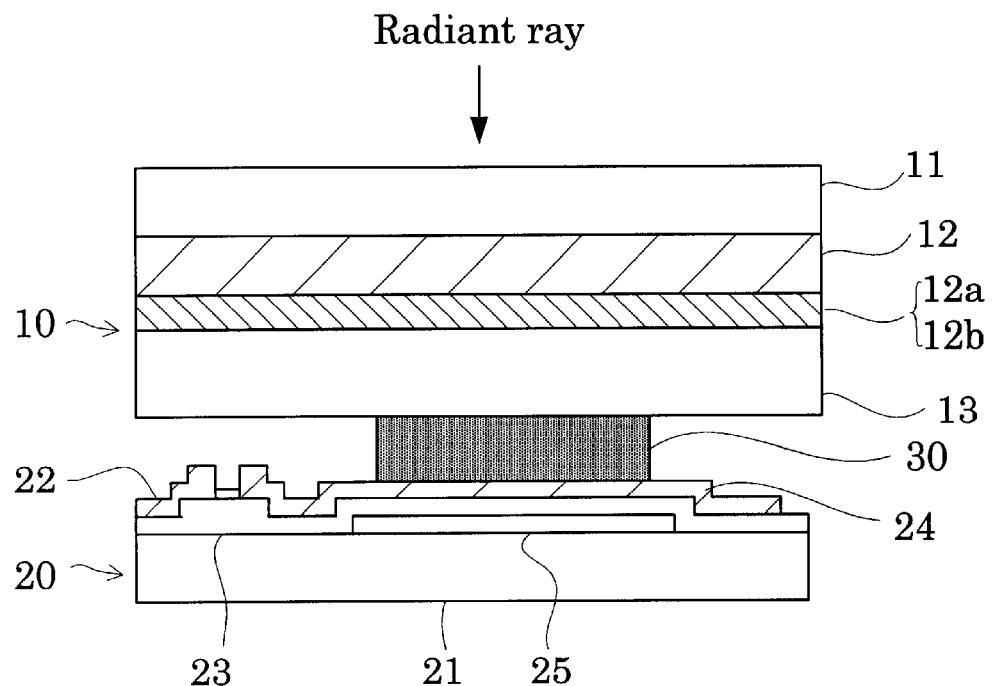
FIG. 5A is a sectional view of an electromagnetic imaging apparatus with a blocking layer formed on a bias application electrode side of a converter layer.

The above material may have a blocking layer formed on a surface thereof, such as an n-type semiconductor film, p-type semiconductor film or heterojunction film. As shown in FIG. 5A, for example, either a hole blocking layer 12a or an electron blocking layer 12b may be disposed between the bias application electrode 12 and converter layer 13. Where the hole blocking layer 12a is provided and a positive (plus) bias voltage is applied to the bias application electrode 12, an n-type hole blocking layer becomes a reverse bias state to block entry of holes to the converter layer 13. On the other hand, where the electron blocking layer 12a is provided and a positive (plus) bias voltage is applied to the bias application electrode 12, a p-type hole blocking layer becomes a reverse bias state to block entry of electrons to the converter layer.

Figure 5B:
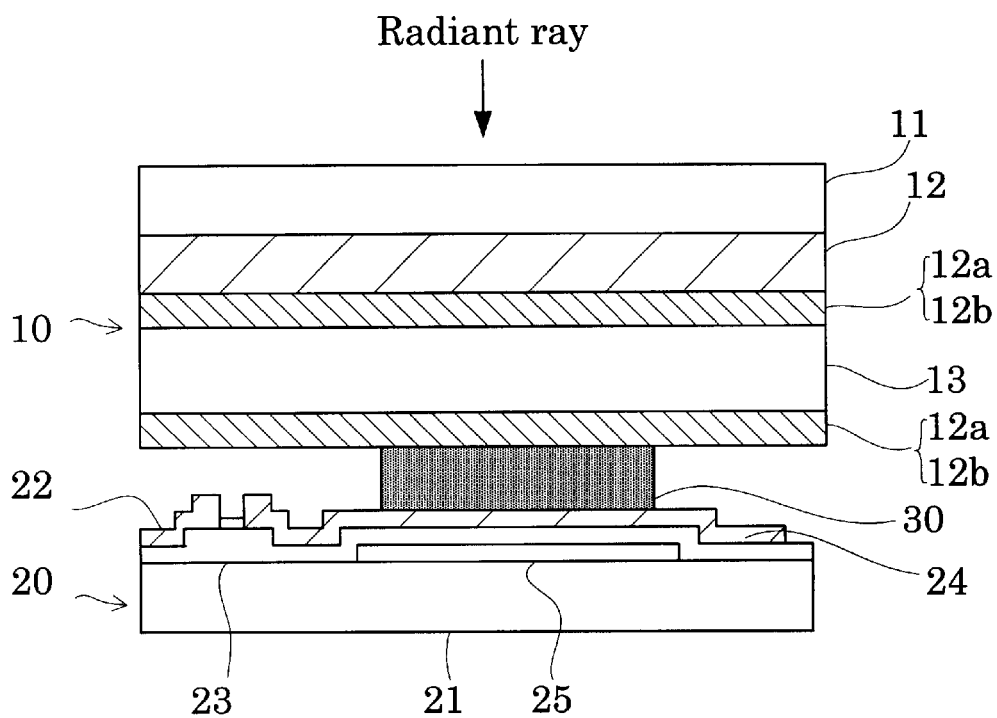
FIG. 5B is a sectional view of an electromagnetic imaging apparatus with blocking layers formed on both the bias application electrode side and a readout panel side of the converter layer.

As shown in FIG. 5B, a blocking layer 12 may be applied to an entire surface between the converter layer 13 and electroconductive resin 30. In this case, depending on the polarity of bias application electrode 12, a hole blocking layer 12a or an electron blocking layer 12b is provided to block entry of holes or electrons to the converter layer 13 from the electroconductive resin 30 also.

By providing a blocking layer 12a or 12b on at least one surface of converter layer 13 as noted above, carriers not contributing to sensitivity may be prevented from entering the converter layer 13. As a result, the converter layer 13 has improved sensitivity (SN ratio).

Figure 2:
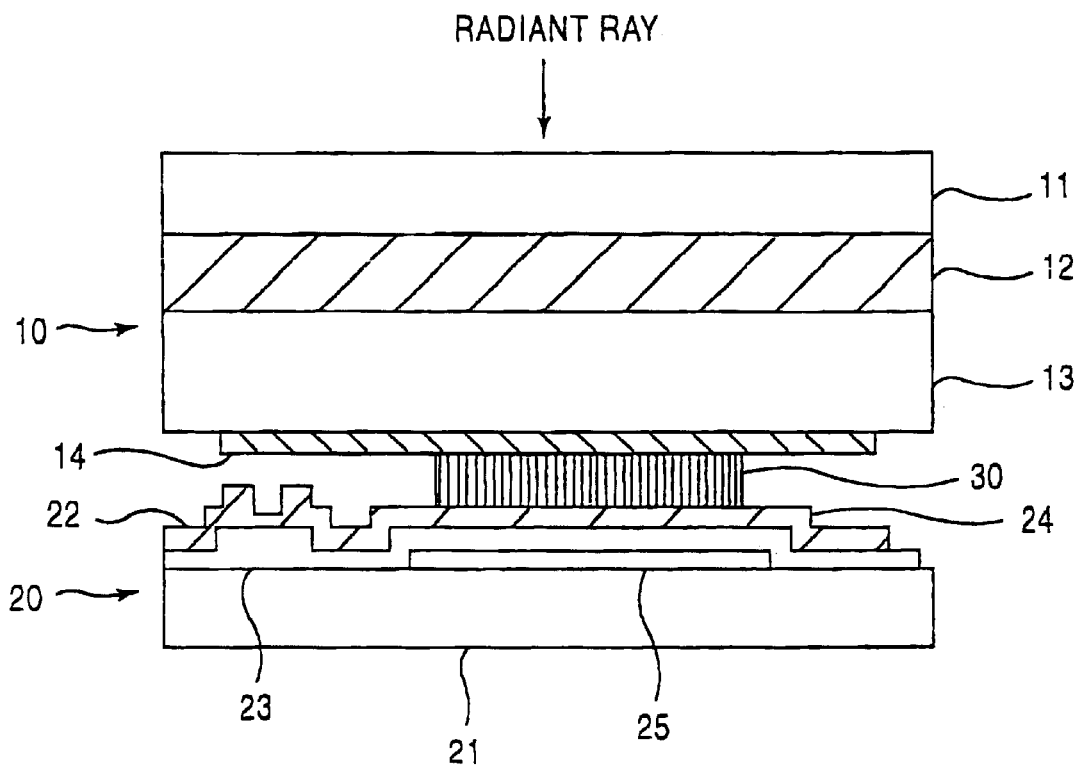
FIG. 2 is a sectional view showing the conventional electromagnetic imaging apparatus.
Figure 6:
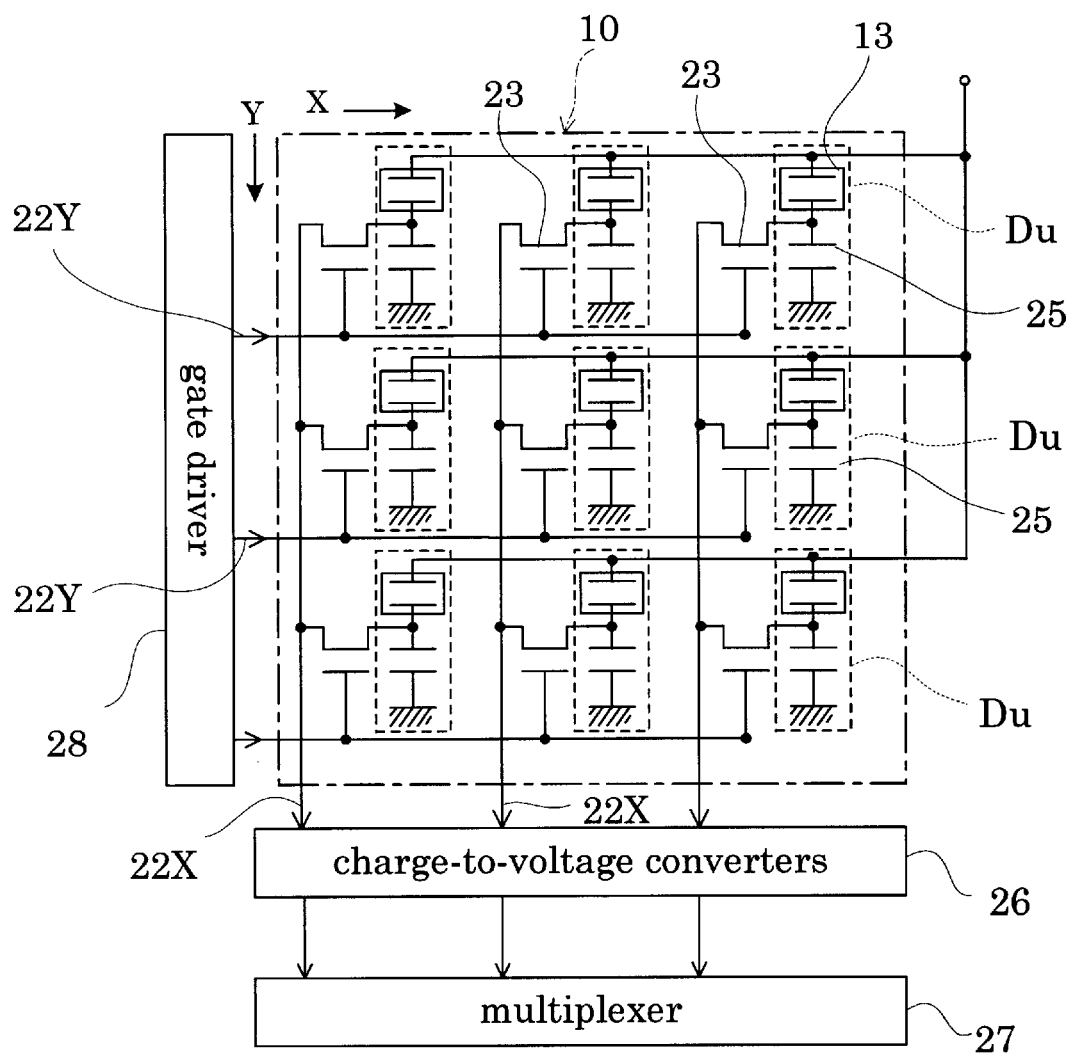
FIG. 6 is a block diagram of an electromagnetic imaging apparatus according to this invention.

As shown in FIGS. 4 and 6, the active matrix panel 20 includes an insulating substrate 21 having electrode lines 22 (22X, 22Y) arranged in a lattice pattern thereon, a plurality of switching elements 23 provided one for each grid element, a plurality of reading electrodes 24 connected to the electrode lines 22 through the switching elements 23, and a plurality of charge collecting stores 25 electrically connected to the reading electrodes 24. This construction is similar to the active matrix panel of the conventional apparatus shown in FIG. 2.

The switching elements 23 are formed of thin film transistors (TFTs) which are turned off when collecting charges in the charge collecting stores 25, and turned on when reading the charges from the charge collecting stores 25. For expediency of illustration, FIG. 6 shows a matrix of 3 by 3. In an actual situation, a matrix in the order of 1024 by 1024 is used.

As shown in FIG. 6, the active matrix panel 20 has pixels Du, including pixel regions of converter layer 13 and the charge collecting stores 25, connected to horizontal and vertical electrode lines 22X and 22Y through the switching elements 23. The electrode lines 22X are connected to a multiplexer 27 through a group of charge-to-voltage converters (group of preamplifiers) 26. The electrode lines 22Y are connected to a gate driver 28.

When reading the charges collected in the charge collecting stores 25, reading scan signals are applied to the multiplexer 27 and gate driver 28. The pixels Du are identified by addresses (e.g. 0 to 1,023) sequentially allocated to the pixels Du along the X- and Y-directions. Thus, the reading scan signals serve as signals designating the addresses in the X-direction or Y-direction.

In response to the scan signals for the Y-direction, the gate driver 28 applies a reading voltage to the electrode lines 22Y arranged in the Y-direction. Then, pixels DU are selected on a row-by-row basis. When the multiplexer 27 is switched successively on a column-by-column basis by the scan signals for the X-direction, the charges collected in the charge collecting stores 25 of pixels Du in the selected rows are successively outputted through the charge-to-voltage converter group 26 and multiplexer 27.

As shown in FIG. 4, the feature of this embodiment lies in that the converter layer 13 of detector panel 10 and each reading electrode 24 of active matrix panel 20 are directly bonded and electrically connected to each other through the electroconductive resin 30. This electroconductive resin 30 is formed of an adhesive and photosensitive resin having carbon powder dispersed therein. The electroconductive resin 30 is prepared in the form of sheets beforehand to be transferred to the active matrix panel 20. A pattern of electroconductive resin 30 is formed on each reading electrode 24 by exposing and developing the transferred resin. At this time, the shape of the pattern is approximately 100 $\mu$m in diameter and 10 $\mu$m thick. In bonding the patterns to the converter layer 13, the filling rate of electroconductive resin 30 is set to 50%. A preferred range of this filling rate is 20 to 90%.

The filling rate of electroconductive resin 30 less than 20% would result in a low charge collecting efficiency and a low reading response characteristic.

Conversely, where the filling rate of electroconductive resin 30 exceeds 90%, variations in the pattern shape and size would occur during a heat pressing process in a manufacturing method described hereinafter. With such variations, adjacent sheets of electroconductive resin 30 could contact one another. That is, interpixel crosstalk would occur.

Examples of adhesive resin for forming the electroconductive resin 30 include epoxy resins, acrylic resins and modified urethane resins. Materials to be mixed for giving electroconductivity include, besides carbon, metallic particles such as of Au and Ag, nickel-plated particles, and transparent electroconductive particles such as of ITO.

Experiment conducted by Inventors has shown that the electromagnetic imaging apparatus having the above construction has a connection resistance not exceeding M$\Omega$ (mega-ohm). It has been confirmed that a connection resistance within this range causes no deterioration in the image characteristics, such as sensitivity, resolution and afterimage, of the electromagnetic imaging apparatus, and that images obtained from this apparatus are by no means inferior to those obtained from a conventional apparatus having separate reading electrodes.

A method of manufacturing the electromagnetic imaging apparatus having the above construction will be described next.

The detector panel 10 and active matrix panel 20 are prepared separately.

Specifically, the detector panel 10 is prepared by depositing the bias application electrode 12 and converter layer 13 in the stated order on the surface of supporting substrate 11, using a film forming technique such as a varied vacuum evaporation method or a CVD (chemical vapor deposition) method.

On the other hand, the active matrix panel 20 is prepared by forming thin film transistors as the switching elements 23 and charge collecting stores 25 on the insulating substrate 21, using the above thin film forming technique or a photolithographic process.

Figure 7A:
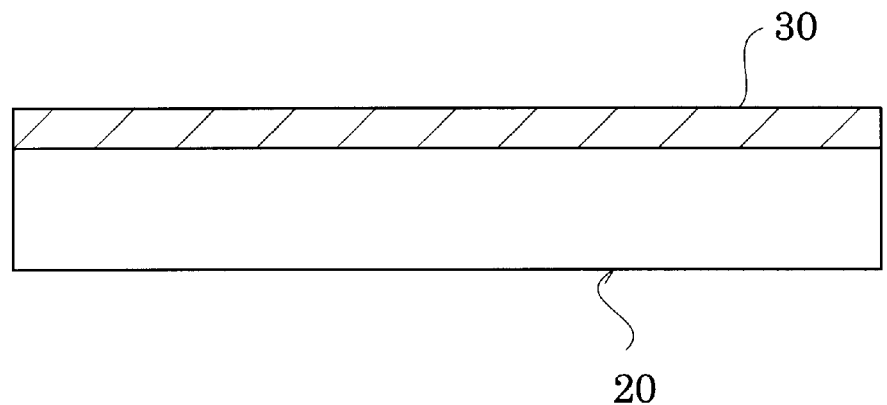
FIG. 7A is a view showing a process of patterning an electroconductive resin.
Figure 7B:
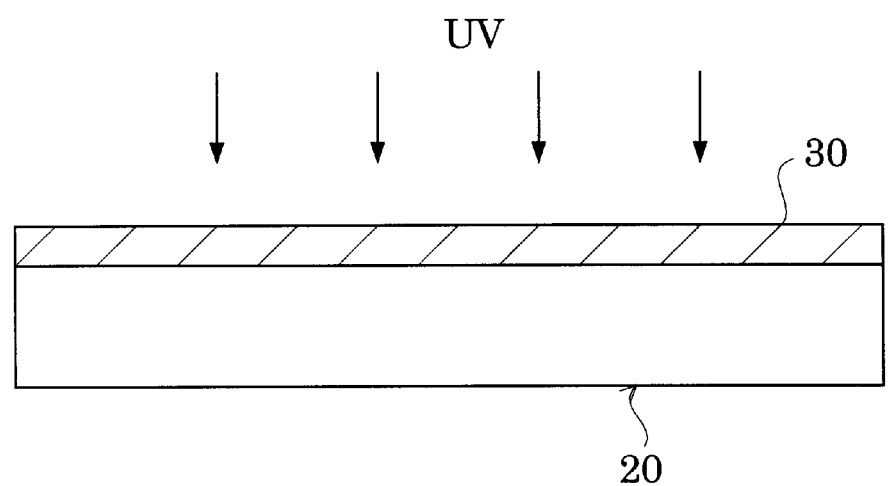
FIG. 7B is another view showing the process of patterning the electroconductive resin.
Figure 7C:
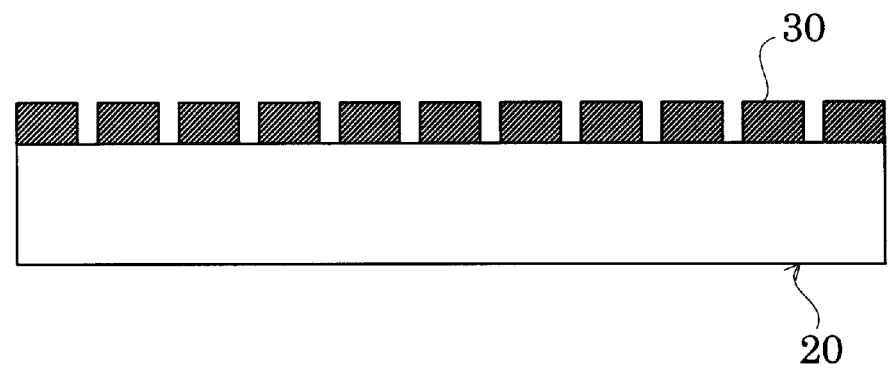
FIG. 7C is yet another view showing the process of patterning the electroconductive resin.
Figure 8A:
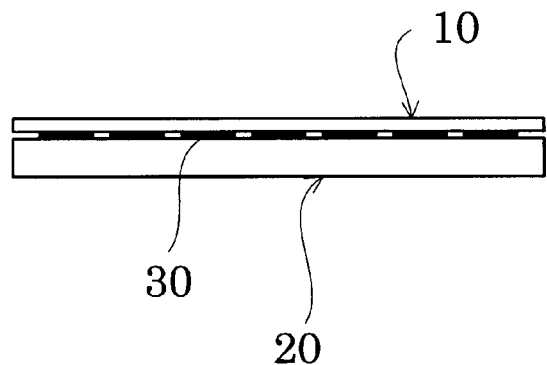
FIG. 8A is a view showing a panel joining process.
Figure 8B:
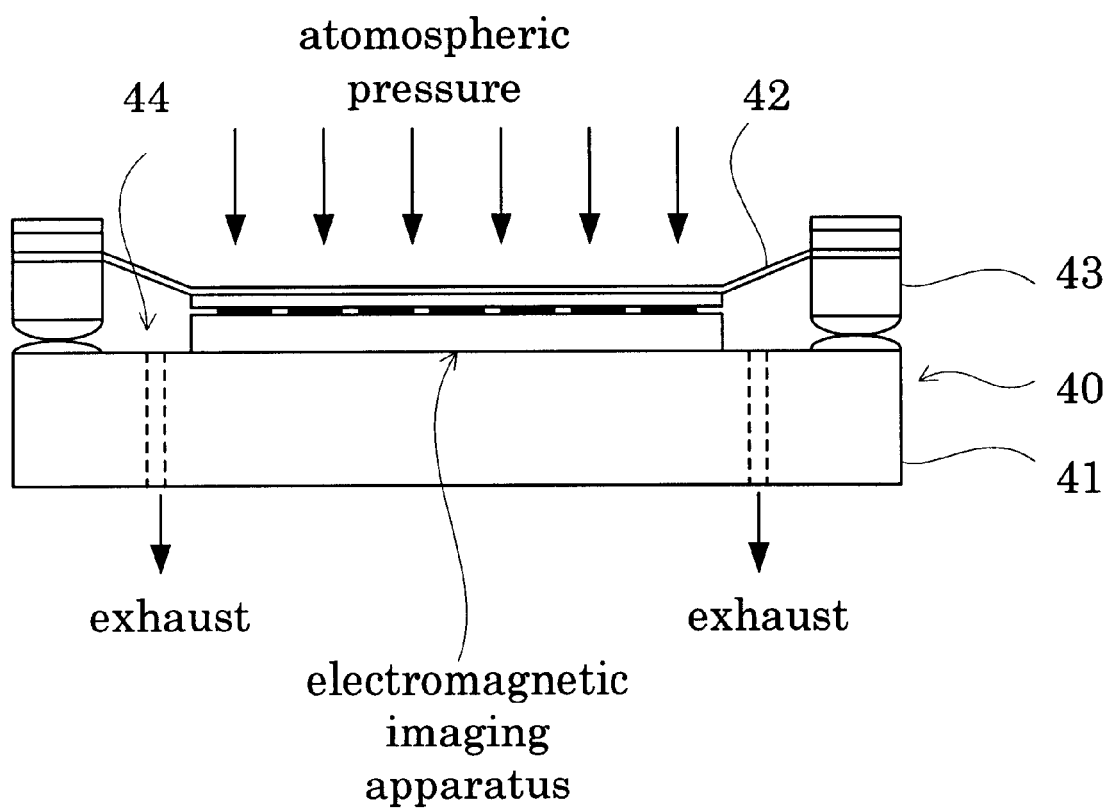
FIG. 8B is a view showing a pressurizing and bonding process.

Next, a method of connecting the detector panel 10 and active matrix panel 20 with the electroconductive resin 30 will be described with reference to FIGS. 7A–7C, 8A and 8B. FIGS. 7A–7C show a process of forming the electroconductive resin 30 on the active matrix panel 20. FIGS. 8A and 8B show a process of joining the detector panel 10 and active matrix panel 20 together.

First, a film base coated with the electroconductive resin 30 is applied to the active matrix panel 20 to transfer the electroconductive resin 30 to the active matrix panel 20 (FIG. 7A). As noted hereinbefore, this electroconductive resin 30 has adhesive and photosensitive properties. Alternatively, the same type of electroconductive resin 30 may be applied to the active matrix panel 20 by spin coating.

Next, by irradiating the active matrix panel 20 with ultraviolet rays through a photomask, a pattern of reading electrodes 24 is exposed on the electroconductive resin 30 (FIG. 7B). By developing the exposed active matrix panel 20 with organic alkali or the like, a patterned electroconductive resin 30 is formed on the reading electrodes 24 (FIG. 7C).

Next, the detector panel 10 and active matrix panel 20 are placed face to face and positionally adjusted to each other (FIG. 8A).

This invention provides no individual pixel electrodes on the surface of converter layer 13 of detector panel 10. Thus, in the manufacturing method according to the invention, the converter layer 13 of detector panel 10 and the reading electrodes 24 of active matrix panel 20 have only to contact each other, and there is no need to place the detector panel 10 and active matrix panel 20 in a strictly adjusted positional relationship.

Next, the two panels 10 and 20 are put to a heat pressing process using a decompression (vacuum) press 40 (FIG. 8B). The decompression press 40 includes a base plate 41 with a built-in heater, and a ring-shaped frame 43 with an elastically deformable sheet 42 extending over the inner opening thereof, to decompress a processing space 44 defined between the base plate 41 and sheet 42. When the processing space 40 is decompressed, the sheet 42 is deformed inwardly by atmospheric pressure to press the detector panel 10 and active matrix panel 20 uniformly upon each other.

By heating the two panels 10 and 20 in the pressurized state, the electroconductive resin 30 present therebetween hardens to bond the panels 10 and 20 together throughout to complete the electromagnetic imaging apparatus in this embodiment.

The detector panel 10 may include a blocking layer 12a or 12b disposed at least either between the bias application electrode 12 and converter layer 13 or on the entire surface of converter layer 13 opposed to the readout panel 20. Such blocking layer may be formed by using a film forming technique such as a varied vacuum evaporation method or a CVD (chemical vapor deposition) method.

The blocking layer 12a or 12b formed on the surface of converter layer 13 opposed to the readout panel 20 need not be smoothed by polishing. That is, the electromagnetic imaging apparatus will have the same level whether the detector panel 10 with the blocking layer 12a or 12b is bonded to the readout panel 20 through the electroconductive resin 30, or the detector panel 10 without the blocking layer 12a or 12b is bonded to the readout panel 20 through the electroconductive resin 30. It has been confirmed through experiment conducted by Inventors that the electromagnetic imaging apparatus with the blocking layer has a connection resistance of MΩ (mega-ohm) which causes no deterioration in image characteristics such as sensitivity, resolution and afterimage.

Figure 9:
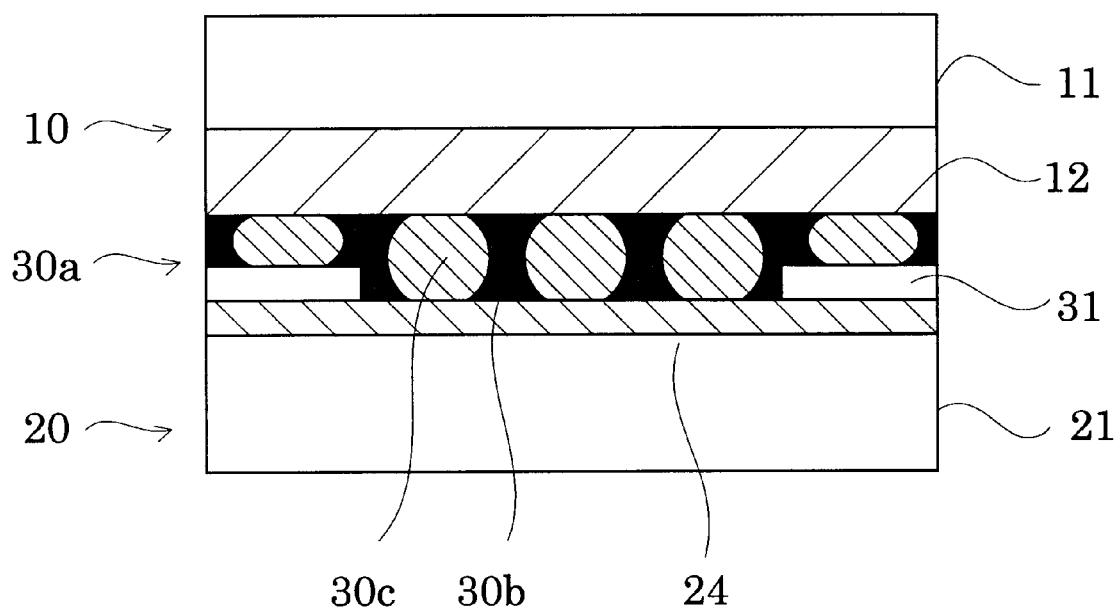
FIG. 9 is a sectional view showing a modified embodiment.

This invention is not limited to the above embodiment, but may be modified as follows:

(1) In the above embodiment, the electroconductive resin 30 is used as an electroconductive material for connecting the converter layer 13 of detector panel 10 to the active matrix panel 20. In place of this resin, an anisotropic electroconductive resin, or metal such as solder or indium, may be used. A case of using an anisotropic electroconductive resin will be described hereinafter with reference to FIG. 9. An anisotropic electroconductive resin 30a is applied substantially over an entire surface of active matrix panel 20 (or detector panel 10). In this state, without patterning the resin 30a, the detector panel 10 and active matrix panel 20 are placed in an opposed relationship. Then, the panels 10 and 20 are pressed and heated to be bonded together. This anisotropic electroconductive resin 30a has, dispersed therein, metallic particles 30c such as of Ag having a diameter in the order of 10 μm, to give electroconductivity to an adhesive insulating resin 30b. These metallic particles 30c form a joint spacing between the detector panel 10 and active matrix panel 20 to secure a low resistance conduction. In addition, the panels 10 and 20 are electrically insulated in planar directions by the insulating resin 30b, to prevent crosstalk occurring among the reading electrodes 24. Reference numeral 31 in FIG. 9 denotes an insulating film opened in the regions of reading electrodes 24. The other aspects of construction and function are the same as in the foregoing embodiment, and will not be described again.

(2) The foregoing embodiment has been described, taking the case of the readout panel acting as an active matrix panel for example. In this invention, the readout panel is not necessarily limited to the active matrix panel. For example, the readout panel may include only reading electrodes 24 formed on the insulating substrate, and reading lines connected to the electrodes 24. The reading lines are connected also to a solid state image sensor such as a CCD, so that the solid state image sensor may collect charges from the detector panel 10.

(3) The foregoing embodiment has been described with reference to an electromagnetic imaging apparatus of two-dimensional matrix construction. This invention is applicable also to an electromagnetic imaging apparatus of one-dimensional array construction with a plurality of pixels arranged linearly.

The present invention may be embodied in other specific forms without departing from the spirit or essential attributes thereof and, accordingly, reference should be made to the appended claims, rather than to the foregoing specification, as indicating the scope of the invention.

What is claimed is:

1. An electromagnetic imaging apparatus comprising a detector panel having a bias application electrode formed on one surface of a supporting substrate, and a converter layer formed on said bias application electrode for generating carriers, which are electron-hole pairs, in response to electromagnetic radiation to be detected, and a readout panel for reading charges generated in said detector panel, wherein said converter layer of said detector panel and said readout panel are bonded to each other directly through a single layer of electroconductive material filled therebetween.

2. An electromagnetic imaging apparatus as defined in claim 1, wherein said readout panel is an active matrix panel of one-dimensional array construction including:

electrode lines arranged in form of a lattice on an insulating substrate;

a plurality of switching elements provided one for each section of said lattice;

a plurality of reading electrodes connected to said electrode lines through said switching elements, respectively; and a plurality of charge collecting stores electrically connected to said reading electrodes, respectively;

said converter layer of said detector panel and said reading electrodes of said active matrix panel of one-dimensional array construction being bonded to each other directly through said single layer of electroconductive material filled therebetween.

3. An electromagnetic imaging apparatus as defined in claim 1, wherein said readout panel is an active matrix panel of two-dimensional matrix construction including:

electrode lines arranged in form of a lattice on an insulating substrate;

a plurality of switching elements provided one for each section of said lattice;

a plurality of reading electrodes connected to said electrode lines through said switching elements, respectively; and a plurality of charge collecting stores electrically connected to said reading electrodes, respectively;

said converter layer of said detector panel and said reading electrodes of said active matrix panel of one-dimensional array construction being bonded to each other directly through said single layer of electroconductive material filled therebetween.

4. An electromagnetic imaging apparatus as defined in claim 1, wherein said electroconductive material is provided at a filling rate of 20 to 90% per unit area of said converter layer of said detector panel.

5. An electromagnetic imaging apparatus as defined in claim 1, wherein said electroconductive material is an electroconductive resin.

6. An electromagnetic imaging apparatus as defined in claim 5, wherein said electroconductive resin has carbon powder dispersed in an adhesive and photosensitive resin.

7. An electromagnetic imaging apparatus as defined in claim 5, wherein said electroconductive resin has metallic particles dispersed in an adhesive and photosensitive resin.

8. An electromagnetic imaging apparatus as defined in claim 5, wherein said electroconductive resin has nickel-plated metallic particles dispersed in an adhesive and photosensitive resin.

9. An electromagnetic imaging apparatus as defined in claim 1, wherein said electroconductive material is an anisotropic electroconductive resin.

10. An electromagnetic imaging apparatus comprising a detector panel having a bias application electrode formed on one surface of a supporting substrate, and a converter layer formed on said bias application electrode for generating carriers, which are electron-hole pairs, in response to electromagnetic radiation to be detected, and a readout panel for reading charges generated in said detector panel, said electromagnetic imaging apparatus further comprising:

a block layer formed in at least one of positions between said bias application electrode and said converter layer and on a surface of said converter layer opposed to said readout panel, wherein the surface layer of said detector panel being either said converter layer opposed to said readout panel or said blocking layer formed on said surface of said converter layer and said readout panel are bonded to each other directly through a single layer of electroconductive material filled therebetween.

11. An electromagnetic imaging apparatus as defined in claim 10, wherein said blocking layer comprises an n-type semiconductor film applied to said surface of said converter layer.

12. An electromagnetic imaging apparatus as defined in claim 10, wherein said blocking layer comprises a p-type semiconductor film applied to said surface of said converter layer.

13. An electromagnetic imaging apparatus as defined in claim 10, wherein said blocking layer comprises a heterojunction film applied to said surface of said converter layer.

14. A method of manufacturing an electromagnetic imaging apparatus including a detector panel having a bias application electrode formed on one surface of a supporting substrate, and a converter layer formed on said bias application electrode for generating carriers, which are electron-hole pairs, in response to electromagnetic radiation to be detected, and a readout panel for reading charges generated in said detector panel, wherein said readout panel is an active matrix panel including electrode lines arranged in form of a lattice on an insulating substrate, a plurality of switching elements provided one for each section of said lattice, a plurality of reading electrodes connected to said electrode lines through said switching elements, respectively, and a plurality of charge collecting stores electrically connected to said reading electrodes, respectively, said method comprising:

a step of preparing said detector panel;

a step of preparing said active matrix panel;

a step of forming a single layer of electroconductive material on each of said reading electrodes of said active matrix panel; and a step of applying said detector panel to said active matrix panel with said single layer of electroconductive material formed thereon to bond said converter layer of said detector panel and each of said reading electrodes of said active matrix panel directly through said single layer of electroconductive material.

15. A manufacturing method as defined in claim 14, wherein said step of forming a single layer of electroconductive material on each of said reading electrodes of said active matrix panel is a step of forming a single layer of electroconductive material on each of said reading electrodes of an active matrix panel of one-dimensional array construction, and said step of applying said detector panel to said active matrix panel with said single layer of electroconductive material formed thereon is a step of applying said detector panel to said active matrix panel of one-dimensional array construction with said single layer of electroconductive material formed thereon.

16. A manufacturing method as defined in claim 14, wherein said step of forming a single layer of electroconductive material on each of said reading electrodes of said active matrix panel is a step of forming a single layer of electroconductive material on each of said reading electrodes of an active matrix panel of two-dimensional matrix construction, and said step of applying said detector panel to said active matrix panel with said single layer of electroconductive material formed thereon is a step of applying said detector panel to said active matrix panel of two-dimensional matrix construction with said single layer of electroconductive material formed thereon.

17. A manufacturing method as defined in claim 14, further comprising a step of forming a blocking layer in at least one of positions between said bias application electrode and said converter layer and on a surface of said converter layer opposed to said readout panel.

* * * * *